US009459307B2

(12) United States Patent
Duran Hernandez et al.

(10) Patent No.: US 9,459,307 B2
(45) Date of Patent: Oct. 4, 2016

(54) ICT FIXTURE AUTO OPEN AND EJECT SYSTEM

(71) Applicant: Flextronics AP, LLC, Broomfield, CO (US)

(72) Inventors: Juan Francisco Duran Hernandez, Jalisco (MX); Jose Antonio Becerra Castrejon, Jalisco (MX)

(73) Assignee: Flextronics AP, LLC, Broomfield, CO (US)

( * ) Notice: Subject to any disclaimer, the term of this patent is extended or adjusted under 35 U.S.C. 154(b) by 315 days.

(21) Appl. No.: 14/198,231

(22) Filed: Mar. 5, 2014

(65) Prior Publication Data

US 2014/0253143 A1 Sep. 11, 2014

Related U.S. Application Data

(60) Provisional application No. 61/772,991, filed on Mar. 5, 2013.

(51) Int. Cl.

| | |
|---|---|
| ***G01R 31/04*** | (2006.01) |
| ***G01R 31/28*** | (2006.01) |
| ***G01R 1/04*** | (2006.01) |
| *G01R 27/26* | (2006.01) |
| *G01D 5/24* | (2006.01) |
| *G01D 5/241* | (2006.01) |

(52) U.S. Cl.

CPC ........... *G01R 31/041* (2013.01); *G01R 1/0408* (2013.01); *G01R 31/04* (2013.01); *G01R 31/2806* (2013.01); *G01R 31/2808* (2013.01); *G01R 31/2818* (2013.01); *G01D 5/24* (2013.01); *G01D 5/241* (2013.01); *G01D 5/2417* (2013.01); *G01R 31/2834* (2013.01)

(58) Field of Classification Search

CPC .. G01R 31/04; G01R 31/025; G01R 31/041; G01R 31/026; G01R 31/024; G01R 1/0408; G01R 31/2808; G01R 31/2818; G01D 5/24; G01D 5/241; G01D 5/2417

USPC ........... 324/66, 71, 378, 403, 415, 425, 500, 324/537, 538, 555, 757.01, 757.02, 762.02, 324/763.01, 513, 661, 695, 701, 756.01

See application file for complete search history.

(56) References Cited

U.S. PATENT DOCUMENTS 4,774,462 A * 9/1988 Black ..................... G01R 1/04 324/754.03
4,812,754 A * 3/1989 Tracy ................ G01R 1/07314 324/72.5
6,535,008 B1 * 3/2003 Casale .............. G01R 31/2887 324/750.25
7,705,611 B2 * 4/2010 Ogata ................ G01D 5/2417 324/658

(Continued)

*Primary Examiner* — Huy Q Phan
*Assistant Examiner* — Raul Rios Russo
(74) *Attorney, Agent, or Firm* — Haverstock & Owens LLP

(57) ABSTRACT

An in-circuit testing auto open and close system, apparatus and method includes an in-circuit tester having an upper panel and a lower panel, wherein the upper and lower panels are used to test electrical connections of one or more electronic units. One or more actuators are each coupled to both the upper panel and the lower panel such that they are able to move the upper and lower panels with respect to each other. As a result, a controller coupled with the in-circuit tester and the actuators is able to cause the actuators to automatically close the panels such that the panels sandwich the electronic units at the beginning of a testing program and to automatically open the panels such that the panels are separated at the end of the testing program.

14 Claims, 4 Drawing Sheets

(56) References Cited

U.S. PATENT DOCUMENTS

2004/0064288 A1* 4/2004 Le .................... G01R 31/2808 702/158

2005/0261854 A1* 11/2005 Adams .............. G01R 31/2808 702/108

2009/0212975 A1* 8/2009 Ausman ............ G01R 31/3277 340/945

* cited by examiner

300a

302a

```
print chr$(27)&"&v7S PRESIONA F1 PARA CONTINUAR "
wait for start
auxconnect5
wait 5
end if

if Serializing then
  print using "@"
  Panel_Serial$ = fn Get_Serial_Num$(Serial_Prompt$)
  Known_Good$ = "n"
  If Panel_Serial$ = Known_Good_Board$ then Known_Good$ = "y"
  call Map_Panel_to_Boards  ! Map panel serial number to indiv. boards
end if

if Using_Multiple_Versions and Version_Prompting = Per_Board then
  call Get_Version_Label
    call Get_Version_Label_Automatic !@ By FD
    if nrun = 1 or Version_Inits_Needed then
      call Do_Version_Inits
    end if
end if
```

```
if panelfailed then
  print "   **  ";Fail_Msg$;"  **"
  if not Using_Graphics then copy Fail_File$ over "/dev/tty"
  copy Fail_File$ over "/dev/tty"
else
  print "   **  ";Pass_Msg$;"  **"
  copy Pass_File$ over "/dev/tty"
print "TIEMPO PRUEBA: ";(B-A)/1000;" secs"

302b { wait 3
       auxdisconnect5
  if not Using_Graphics then copy Pass_File$ over "/dev/tty"
end if

Pass_Fail_Reported = True

for I = 1 to Number_Boards_On_Panel
  board number is I
  if Status(I) <> Xed_Out then
    if boardfailed then
      if Using_Graphics then
        board graphics highlight fail board I, Err
      else
        Err = True
```

Fig. 3B

ICT FIXTURE AUTO OPEN AND EJECT SYSTEM

RELATED APPLICATIONS

This Patent Application claims priority under 35 U.S.C. 119 (e) of the U.S. Provisional Application, Ser. No. 61/772,991, filed Mar. 5, 2013, and entitled "ICT Fixture Auto Open & Eject System," which is hereby incorporated by reference.

FIELD OF THE INVENTION

The present invention is generally directed to the field of in-circuit testing (ICT) fixtures. More specifically, the invention is directed to the field of an ICT fixture for testing printed circuit board assemblies and printed circuit boards.

BACKGROUND OF THE INVENTION

Printed circuit board assemblies (PCBAs) and printed circuit boards (PCBs) are usually tested after being manufactured in order to detect any manufacturing defects. Generally speaking, PCB testing may be categorized as bare-board testing whereas PCBA testing can be categorized as loaded-board testing. During bare-board testing, a bare PCB, without any components and/or devices attached thereto, is tested to verify the continuity of the traces between the pads and/or the vias on the board. During loaded-board testing, a PCBA with some or all of the electrical components and/or devices mounted thereto is tested in order to verify that all the required electrical connections have been properly completed. Additionally, loaded-board testing can also include integrated circuits (hereinafter "IC" or "ICs") testing to verify that the components mounted on the PCB perform within specifications. Operation of these tests requires one or more operators to provide inputs to the testing controller, to continuously monitor the units under testing (UUT) as well as to manually open and close the testing apparatus before and after the testing. All of this activity increases the cost of the testing process and therefore the cost of the UUTs.

SUMMARY OF THE INVENTION

Embodiments of an ICT device, system and method of operation are directed to a controller electrically coupled with a testing device, one or more UUTs and an actuating mechanism. The controller is able to utilize the actuating mechanism to automatically open or close the testing device when the UUTs are in position to be tested and/or have finished testing. As a result, the system is able to provide the advantage of eliminating the risks and costs of human operators opening and closing the testing device.

One aspect is directed to an in-circuit testing apparatus. The apparatus comprises an in-circuit tester including a body having an upper panel and a lower panel. The upper and lower panels are configured to test electrical connections of one or more electronic units. One or more actuators are each coupled to both the upper panel and the lower panel and is configured to move the upper and lower panels with respect to each other. A controller is coupled with the in-circuit tester and the actuators and configured to cause the actuators to automatically close the panels such that the panels sandwich the electronic units at the beginning of a testing program and to automatically open the panels such that the panels are separated at the end of the testing program. In some embodiments, the in-circuit tester comprises a vacuum and the controller causes the vacuum to create a hermetic seal between the upper and lower panels and the units after the panels are closed. In some embodiments, the in-circuit tester comprises one or more safety sensors that detect when an object is between the upper and lower panels. In some embodiments, the controller comprises a memory storing the testing program, wherein the testing program causes the testing of the units by the in-circuit tester and includes embedded open commands that cause the actuators to open the upper and lower panels and close commands that cause the actuators to close the upper and lower panels. In some embodiments, one or more of the actuators are pneumatic actuators. In some embodiments, the in-circuit tester comprises a kill switch which, when activated, overrides all other input and enables the upper and lower panels to be opened. In some embodiments, the controller is integrated into the housing of the in-circuit tester. In some embodiments, the in-circuit tester comprises one or more unit fixtures that provide an electrical interface between the units and the in-circuit panels such that the in-circuit tester and the units are able to exchange electrical signals via the unit fixtures.

Another aspect is directed to a method of operating an in-circuit testing apparatus. The method comprises positioning one or more electronic units within an in-circuit tester having a body including an upper panel and a lower panel, causing one or more actuators to automatically close the panels with a controller coupled with the in-circuit tester such that the panels sandwich the electronic units at the beginning of a testing program, wherein the one or more actuators are each coupled to both the upper panel and the lower panel and configured to move the upper and lower panels with respect to each other, testing the electrical connections of the one or more electronic units with the upper and lower panels based on the testing program and causing one or more actuators to automatically open the panels with the controller such that the panels are separated at the end of the testing program. In some embodiments, the method further comprises causing a vacuum of the in-circuit tester to create a hermetic seal between the upper and lower panels and the units with the controller after the panels are closed. In some embodiments, the method further comprises detecting if an object is between the upper and lower panels with one or more safety sensors of the in-circuit tester and stopping the actuators from closing the upper and lower panels if the object is detected as being between the upper and lower panels by the safety sensors. In some embodiments, the testing program causes the testing of the units by the in-circuit tester and includes embedded open commands that cause the actuators to open the upper and lower panels and close commands that cause the actuators to close the upper and lower panels. In some embodiments, one or more of the actuators are pneumatic actuators. In some embodiments, the method further comprises enabling the upper and lower panels to be opened regardless of conflicting input from the testing program when a kill switch of the in-circuit tester is activated. In some embodiments, the controller is integrated into the housing of the in-circuit tester. In some embodiments, positioning the one or more electronic units within the in-circuit tester comprises coupling the units with one or more unit fixtures of the in-circuit tester, wherein the unit fixtures provide an electrical interface between the units and the in-circuit panels such that the in-circuit tester and the units are able to exchange electrical signals via the unit fixtures.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIGS. 3A and 3B illustrate ICT control commands according to some embodiments.

DETAILED DESCRIPTION OF THE EMBODIMENTS

Embodiments of the present application are directed to an ICT device, system and method of operation. Those of ordinary skill in the art will realize that the following detailed description of the ICT device, system and method of operation is illustrative only and is not intended to be in any way limiting. Other embodiments of the invention will readily suggest themselves to such skilled persons having the benefit of this disclosure.

Reference will now be made in detail to implementations of the ICT device, system and method of operation as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
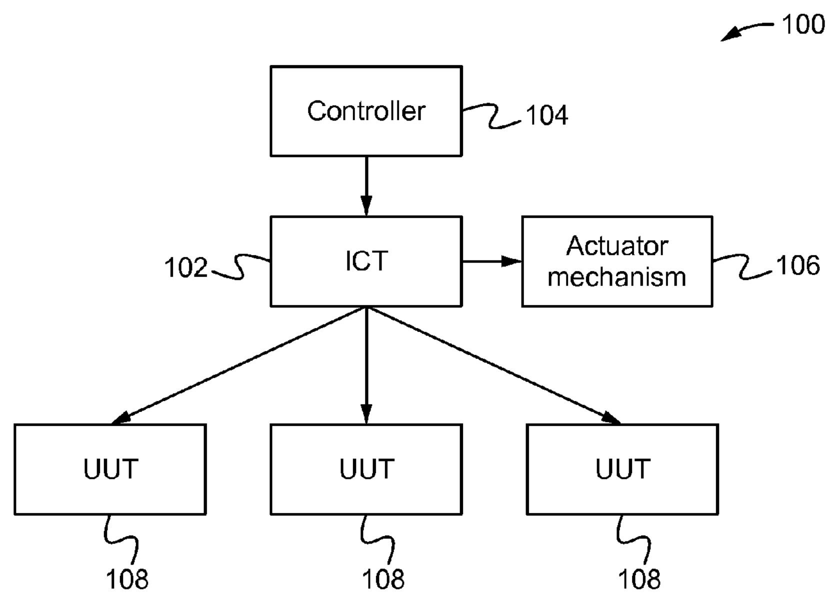
FIG. 1 illustrates an ICT system according to some embodiments.

FIG. 1 illustrates an ICT system 100 according to some embodiments. As shown in FIG. 1, the system 100 comprises an ICT 102, an actuator mechanism 106, a controller 104 and one or more UUTs 108. Alternatively, the controller 104 is able to be incorporated with the ICT 102 such that the ICT 102 comprises a built-in controller within the ICT 102 that controls the operation of the ICT 102. In some embodiments, the controller 104 comprises a display and/or one or more peripheral devices to display and provide an user interface with the results of the ICT 102 testing. Alternatively, if the controller 104 is incorporated within the ICT 102, the display and/or peripherals are able to be separate from the controller 104. It is understood that the ICT 102, the actuator mechanism 106 and/or the controller 104 are able to comprise processing elements, memory and/or other circuitry well known in the art that have been omitted herein for the sake of brevity.

The ICT 102 is able to be physically coupled with the actuator mechanism 106 such that the mechanism 106 is able to physically open or close the ICT 102. The UUTs 108 are able to be selectively electrically coupled with the ICT 102 such that the ICT 102 is able to perform electrical tests on each of the coupled UUTs 108. Although as shown in FIG. 1 the ICT 102 is coupled with three UUTs 108, more or less UUTs 108 are contemplated. The controller 104 is electrically coupled with the ICT 102 and/or the actuator mechanism 106 in order to send electrical control signals (e.g. see FIGS. 3A and 3B) to the ICT 102 and/or the actuator mechanism 106 that control their operation. For example, the controller 104 is able to cause the actuator mechanism 106 to close the ICT 102 when the UUTs 108 are in position within the ICT 102, the ICT 102 to test the UUTs 108, and then the actuator mechanism 106 to automatically open when the testing is complete. As a result, the system 100 provides the advantage of eliminating the need for an operator to continuously open and close the ICT 102.

In some embodiments, the system 100 further comprises one or more UUT and/or operator safety sensors coupled to the ICT 102, the controller 102 and/or the actuator mechanism 106. In some embodiments, one or more of the UUT sensors are able to detect the position of the UUTs 108 within the ICT 102 and prevent the closure of the ICT 102 by the actuator mechanism 106 if one or more of the UUTs 108 are misaligned or otherwise improperly coupled with the ICT 102. In some embodiments, the UUT safety sensors are able to detect the position of the UUTs 108 mechanically and/or electrically based on physical and/or electrical connections between the UUTs 108 and the ICT 102 monitored by the sensors. Alternatively or in addition, the UUT safety sensors are able to detect the position of the UUTs 108 visually based on a camera or other light-sensing device that is able to observe the positioning of the UUTs 108 within the ICT 102. In some embodiments, one or more of the operator safety sensors are able to detect the position of the operators or other users relative to the ICT 102 and prevent the closure of the ICT 102 by the actuator mechanism 106 if an operator or user is in a dangerous area. For example, the operator safety sensors are able to detect if an object (e.g. operator hand) is between or proximate the panels of the ICT 102 and/or in the path of the closing panels of the ICT 102. Similar to the UUT safety sensors, these operator sensors are able to detect the position of the operators visually based on a camera or other light-sensing device that is able to observe the positioning of the operators relative to the ICT 102.

In operation, as described above, after the UUTs 108 have been positioned within the ICT 102 (and no safety sensor warnings have been received), the controller 104 sends control commands to the ICT 102 and/or actuator mechanism 106 to automatically close the ICT 102 around the UUTs 108 and begin the testing process. During the testing process, the ICT 102 provides a useful and efficient form of UUT 108 (e.g. printed circuit board) testing by measuring each component of the UUTs in turn to check that it is in place and of the correct value. As most faults on a UUT 108 arise out of the manufacturing process and usually consist of short circuits, open circuits or wrong components, this form of testing catches most of the problems on a board. These are able to easily be checked using simple measurements or resistance, capacitance, and sometimes inductance between two points on the UUTs 108. In some embodiments, each of the UUTs 108 are tested in parallel. Alternatively, one or more of the UUTs 108 are able to be tested serially. Subsequently, after testing of the UUTs 108 has been completed, the controller 104 sends control commands to the ICT 102 and/or actuator mechanism 106 to automatically open the ICT 102 around the UUTs 108 such that the UUTs 108 are able to be removed.

Figure 2:
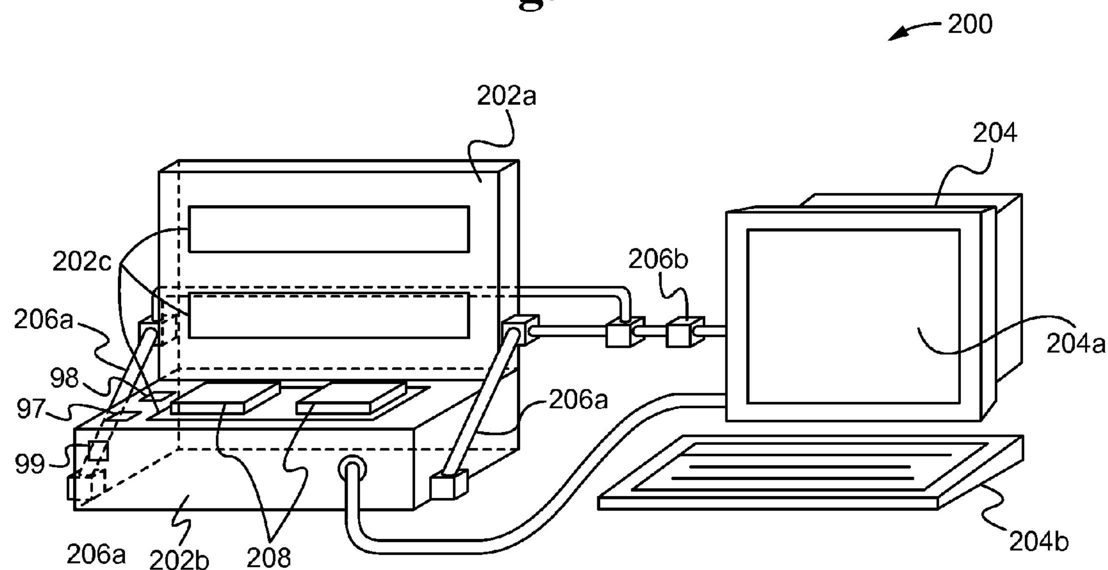
FIG. 2 illustrates an ICT apparatus according to some embodiments.

FIG. 2 illustrates an ICT apparatus 200 according to some embodiments. As shown in FIG. 2A, the apparatus 200 comprises an ICT 202 having a top panel **202*a* and a bottom panel 202*b*, an actuator mechanism 206 having a plurality of extending elements 206*a* and a control interface 206*b*, a controller 204 having a display 204*a* and one or more peripherals 204***b* and one or more UUTs 208. As described above, some or all of the controller 204 is able to be incorporated into the ICT 202. In some embodiments, as described above, the ICT 102 is able to comprise one or more UUT safety sensors 98 and/or one or more operator safety sensors 97. Although as shown in FIG. 2, the safety sensors 98 and 97 are located on the bottom panel 202*b* of the ICT 202, one or more of the safety sensors 98, 97 are able to be located in other positions on the ICT 202 (e.g. the top panel 202*a*) and/or be separate from but coupled with the ICT 202.

Each of the extending elements 206*a* of the actuator mechanism 206 have a first end coupled to the top panel 202*a* of the ICT 202 and a second end coupled to the bottom panel 202*b*. As shown in FIG. 2, the elements 206*a* are coupled to opposite sides of the ICT 202. Alternatively, one or more of the elements 206*a* are able to be positioned on other parts of the ICT 202. Additionally, the first and second ends of the extending elements 206*a* are able to move with respect to each other (e.g. via a telescoping action) that causes the top panel 202*a* to cover and/or contact the bottom panel 202*b* such that the UUTs 208 are sandwiched when the ends move closer together and causes the top panel 202*a* and the bottom panel 202*b* to separate and reveal the UUTs 208 when the ends move apart. The control interface 206*b* electrically coupled with the controller 204 and is operatively (e.g. electrically) and/or physically coupled with the extending elements 206*a* such that based on commands received from the controller 204, the control interface 206*b* is able to cause one or more of the elements 206*a* to selectively extend or retract their ends as desired thereby selectively automatically opening or closing the ICT panels 202*a*, 202*b*. In some embodiments, the control interface 206*b* causes the ends to move between an open position and a closed position. Alternatively, the control interface 206*b* is able to move the elements 206*a* together or independently between any number of positions or extension lengths. In some embodiments, the extending elements 206*a* comprise pneumatic pistons, a pneumatic valve, a tube splitter, an air pressure regulator and/or an air release valve. Alternatively, one or more of the extending elements 206*a* are able to comprise pneumatic, hydraulic, mechanical, electric or other types of pistons, actuators or other actuating mechanisms known in the art. In some embodiments, the controller 204 interfaces or communicates with the control interface 206*b* via the ICT 202 (e.g. an ICT system card). Alternatively, the controller 204 is able to interface or communicate with the control interface 206*b* directly.

The ICT 202 is electrically coupled with the controller 204 and selectively coupled with the UUTs 208 such that the ICT 202 is able to perform tests on each of the coupled UUTs 208. Although as shown in FIG. 2 the ICT 202 is coupled with two UUTs 208, more or less UUTs 208 are contemplated. The controller 204 is electrically coupled with the ICT 202 (and/or the control interface 206*b* of the actuator mechanism 206 as described above) in order to send electrical control signals (e.g. see FIGS. 3A and 3B) to the ICT 202 and/or the actuator mechanism 206 that control their operation. As a result, the controller 204 is able to select the position of the ICT panels 202*a*, 202*b* (e.g. open or closed) by sending command signals to the control interface 206*b* while concurrently sending command signals to the ICT 202 that causes the ICT 202 to begin testing of the UUTs 208 when closed. Additionally, in some embodiments the controller 204 is able to receive one or more warning signals from the sensors 98, 97 and stop and/or reverse operation of the ICT 202 and/or the actuator mechanism 206 based on the warning signals in order to prevent injury or malfunction.

The panels 202*a*, 202*b* of the ICT 202 are able to be rotatably coupled together such that one panel 202*a* is able to move with respect to the other panel 202*b*. For example, in some embodiments the ends of the panels 202*a*, 202*b* are coupled together via a hinge that enables the panels 202*a*, 202*b* to rotate with respect to each other from a stacked or parallel position where the UUTs 208 are sandwiched in between the panels 202*a*, 202*b* to an "open mouth" position where the panels 202*a*, 202*b* are angled with respect to each other such that the UUTs 208 are accessible. In some embodiments, the panels 202*a*, 202*b* comprise a matrix of drivers and sensors that are used to set up and perform the UUT 208 testing measurements and operations. For example, the panels 202*a*, 202*b* are able to comprise 1000 or more of these driver sensor points. In some embodiments, the panels 202*a*, 202*b* comprise a vacuum mechanism that is able to hermetically seal the panels 202*a*, 202*b* together by applying a vacuum between the panels 202*a*, 202*b* when they are in the closed position. As a result, the UUTs 208 are able to be sealed in between the panels 202*a*, 202*b* creating better testing environment.

In some embodiments, the ICT 202 is able to further comprise one or more fixtures 202*c* that provide an interface between the panels 202*a*, 202*b* and the UUTs 208. Specifically, the fixtures 202*c* are able to take the connections for the driver sensor points of the panels 202*a*, 202*b* and route them directly to the relevant points on the UUTs 208 using different routing mechanisms (e.g. a "bed of nails"). Although all of the fixtures 202*c* are able to interface with the panels 202*a*, 202*b* (and/or the remainder of the ICT 202), each of the fixtures 202*c* are UUT-specific such that their design or configuration is based on one or more types of UUTs 208 and they are only able to interface with the types of UUTs 208 based on which they were designed. As a result, different fixtures 202*c* are able to be replaced and/or mixed and matched such that the ICT 202 is able to interface with and test different types of UUTs 208 by simply selecting a fixture 202*c* designed based on the desired type or types of UUTs 208. In some embodiments, the ICT 202 comprises a kill switch 99 that is configured to automatically cause the actuator mechanism 206 to open the panels 202*a*, 202*b* and/or cause the actuator mechanism 206 to disengage such that the panels 202*a*, 202*b* are able to be manually opened in case of an emergency. Alternatively, the kill switch 99 is able to be configured to turn the ICT 202 on and off. In some embodiments, the UUTs 208 comprise integrated circuits and/or printed circuit board assemblies having integrated circuits and/or other electrical components. Alternatively, one or more of the UUTs 208 are able to comprise other electrical devices for testing. As a result, the apparatus 200 provides the advantage of eliminating the need for an operator to continuously open and close the ICT 202 as well as providing safety measures for safer operation of the automatic opening and closing.

FIGS. 3A and 3B illustrate ICT control commands according to some embodiments. In particular, FIG. 3A illustrates an exemplary testing program startup 300*a* wherein the automatic ICT close commands 302*a* are embedded within the program 300*a*. As a result, in the course of execution of the program 300*a* the controller 204 will cause the mechanism 206 to close the panels 202*a*, 202*b* around the UUTs 208 and then proceed with the testing operations. In some embodiments, the testing program 300*a* is able to further comprise an embedded vacuum seal command that causes a vacuum to be produced between the panels 202*a*, 202*b* as described above. In some embodiments, the testing program 200*a* is able to further comprise a safety close check command that queries or checks input from one or more of the safety sensors 98, 97 as described above before automatically closing and/or proceeding with the testing operations. Similarly, FIG. 3B illustrates an exemplary testing program shutdown 300*b* wherein the automatic ICT open commands 302*b* are embedded within the program 300*b*. As a result, in the course of execution of the program 300*b*, after completing the testing operation on the UUTs 208, the controller 204 will cause the mechanism 206 to automatically open the panels 202*a*, 202*b* exposing the UUTs 208. In some embodiments, the testing program 300*b* is able to further comprise a safety open check command that queries or checks input from one or more of the safety sensors 98, 97 as described above before automatically opening to ensure nothing is in a dangerous area. It should be noted that the specific testing operation language of the programs 300*a*, 300*b* is based on the ICT 202 hardware/software and/or the type of UUTs 208 to be tested. For example, different types of tests and/or different parameters for the tests performed as instructed by the programs 300*a*, 300*b* are able to be tailored based on the type of UUTs 208 to be tested.

Figure 4:
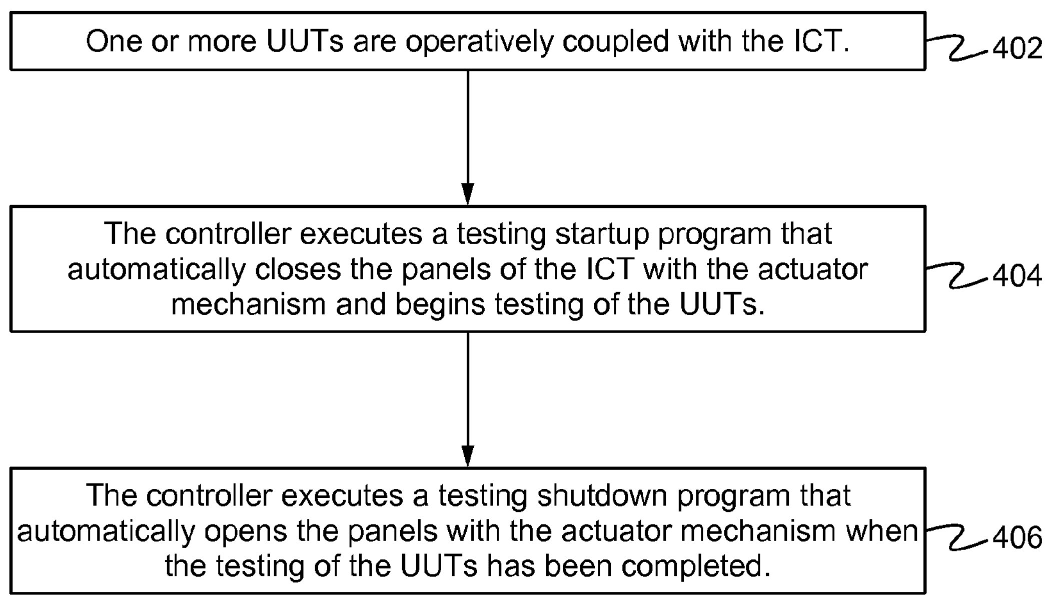
FIG. 4 illustrates a method of operating an ICT system according to some embodiments.

FIG. 4 illustrates a method of operating an ICT system according to some embodiments. At the step 402, one or more UUTs 208 are operatively coupled with the ICT 202. In some embodiments, the coupling with the ICT 202 comprises physically and/or electrically coupling each of the UUTs 208 with a corresponding fixture 202*c* of the ICT 202. At the step, 404, the controller 204 executes a testing startup program that automatically closes the panels 202*a*, 202*b* of the ICT 202 with the actuator mechanism 206 and begins testing of the UUTs 208. In some embodiments, while executing the testing startup program the controller 204 checks a status or input from one or more of the safety sensors 98, 97 and only closes the panels 202*a*, 202*b* if the safety sensors 98, 97 indicate that it is safe to do so. In some embodiments, while executing the testing startup program the controller 204 causes a vacuum mechanism of the ICT 202 to create a vacuum between the panels 202*a*, 202*b* in order to seal the UUTs 208 within the ICT 202. At the step 406, the controller executes a testing shutdown program that automatically opens the panels 202*a*, 202*b* with the actuator mechanism 206 when the testing of the UUTs 208 has been completed. In some embodiments, while executing the testing shutdown program the controller 204 checks a status or input from one or more of the safety sensors 98, 97 and only opens the panels 202*a*, 202*b* if the safety sensors 98, 97 indicate that it is safe to do so (i.e. no users are detected within the area). As a result, the method provides the advantage of eliminating the need of an operator to open and close the ICT 202 which removes human error, saves cost and reduces the risk of injury.

The present application has been described in terms of specific embodiments incorporating details to facilitate the understanding of the principles of construction and operation of the power converter. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An in-circuit testing apparatus comprising:

an in-circuit tester including body having an upper panel and a lower panel, wherein the upper and lower panels each comprise one or more electrical drivers that are configured to test electrical connections of one or more electronic units;

one or more actuators that are each coupled to both the upper panel and the lower panel and configured to move the upper and lower panels with respect to each other; and a controller coupled with the in-circuit tester and the actuators and configured to cause the actuators to automatically close the panels such that the panels sandwich the electronic units at the beginning of a testing program and to automatically open the panels such that the panels are separated at the end of the testing program, wherein the controller comprises a memory storing the testing program, wherein the testing program causes the testing of the units by the in-circuit tester and includes embedded open commands that cause the actuators to open the upper and lower panels and close commands that cause the actuators to close the upper and lower panels.

2. The apparatus of claim 1 wherein the in-circuit tester comprises a vacuum and the controller causes the vacuum to create a hermetic seal between the upper and lower panels and the units after the panels are closed.

3. The apparatus of claim 1 wherein the in-circuit tester comprises one or more safety sensors that detect when an object is between the upper and lower panels.

4. The apparatus of claim 1 wherein one or more of the actuators are pneumatic actuators.

5. The apparatus of claim 1 wherein the in-circuit tester comprises a kill switch which when activated overrides all other input and enables the upper and lower panels to be opened.

6. The apparatus of claim 1 wherein the controller is integrated into the housing of the in-circuit tester.

7. The apparatus of claim 1 wherein the in-circuit tester comprises one or more unit fixtures that provide an electrical interface between the units and the in-circuit panels such that the in-circuit tester and the units are able to exchange electrical signals via the unit fixtures.

8. A method of operating an in-circuit testing apparatus, the method comprising:

positioning one or more electronic units within an in-circuit tester having a body including an upper panel and a lower panel, wherein each of the upper panel and the lower panel comprise one or more electrical drivers;

causing one or more actuators to automatically close the panels with a controller coupled with the in-circuit tester such that the panels sandwich the electronic units at the beginning of a testing program, wherein the one or more actuators are each coupled to both the upper panel and the lower panel and configured to move the upper and lower panels with respect to each other;

testing the electrical connections of the one or more electronic units with the one or more drivers of both the upper panels and the lower panels based on the testing program, wherein the testing program causes the testing of the units by the in-circuit tester and includes embedded open commands that cause the actuators to open the upper and lower panels and close commands that cause the actuators to close the upper and lower panels; and causing one or more actuators to automatically open the panels with the controller such that the panels are separated at the end of the testing program based on the embedded open commands.

9. The method of claim 1 further comprising causing a vacuum of the in-circuit tester to create a hermetic seal between the upper and lower panels and the units with the controller after the panels are closed.

10. The method of claim 1 further comprising detecting if an object is between the upper and lower panels with one or more safety sensors of the in-circuit tester and stopping the actuators from closing the upper and lower panels if the object is detected as being between the upper and lower panels by the safety sensors.

11. The method of claim 1 wherein one or more of the actuators are pneumatic actuators.

12. The method of claim 1 further comprising enabling the upper and lower panels to be opened regardless of conflicting input from the testing program when a kill switch of the in-circuit tester is activated.

13. The method of claim 1 wherein the controller is integrated into the housing of the in-circuit tester.

14. The method of claim 1 wherein positioning the one or more electronic units within the in-circuit tester comprises coupling the units with one or more unit fixtures of the in-circuit tester, wherein the unit fixtures provide an electrical interface between the units and the in-circuit panels such that the in-circuit tester and the units are able to exchange electrical signals via the unit fixtures.

* * * * *